United States Patent [19]

Tokunaga et al.

[11] 4,039,864

[45] Aug. 2, 1977

[54] SEMICONDUCTOR BIDIRECTIONAL SWITCH CIRCUIT

[75] Inventors: Michio Tokunaga, Zushi; Ichiro Ohhinata, Yokohama; Shinzi Okuhara, Fujisawa, all of Japan

[73] Assignee: Hitachi, Ltd., Japan

[21] Appl. No.: 690,587

[22] Filed: May 27, 1976

[30] Foreign Application Priority Data

May 30, 1975 Japan .................................. 50-64248
July 31, 1975 Japan .................................. 50-93812

[51] Int. Cl.² .............................................. H03K 17/72
[52] U.S. Cl. ......................... 307/252 T; 307/252 UA; 323/22 SC; 307/252 G
[58] Field of Search ........... 307/252 N, 252 Q, 252 T, 307/252 UA, 252 G; 323/22 SC; 179/18 GF

[56] References Cited

U.S. PATENT DOCUMENTS

3,237,030  2/1966  Coburn .............................. 307/252 T
3,283,177  11/1966 Cooper .............................. 307/252 T

*Primary Examiner*—John Zazworsky
*Attorney, Agent, or Firm*—Craig & Antonelli

[57] ABSTRACT

A semiconductor bidirectional switch circuit comprises a bidirectional switch including two thyristors connected in antiparallel relationship. A bypass circuit is connected to each of the two thyristors for bypassing a part of a main current flowing through the thyristor from the anode to the cathode of the thyristor. A cathode-gate driver circuit is connected to the cathode-gate of each of the two thyristors for supplying a current thereto and a driver circuit is connected to the base of the transistor constituting each of the two bypass circuits, for extracting a current from the base, whereby the gate current of either of the thyristors is allowed to continue flowing at a low drive voltage irrespective of the amplitude of an AC signal voltage which passes through the bidirectional switch circuit so that even when the AC signal current decreases in absolute value below the self-holding current of the thyristor associated, the AC signal may be passed through the thyristor switch without being subjected to instantaneous interruptions.

15 Claims, 8 Drawing Figures

SEMICONDUCTOR BIDIRECTIONAL SWITCH CIRCUIT

This invention relates to a semiconductor bidirectional switch circuit used for telephone exchange systems and the like systems which employs thyristors and which is capable of passing a full wave of AC signal.

As a bidirectional switch circuit with thyristors for switching an AC signal, one type has hitherto been available wherein thyristors are connected in antiparallel relationship to constitute a bidirectional switch and an AC signal is passed through the bidirectional switch by supplying currents to the gates of the two thyristors from a driver circuit. In the prior art bidirectional switch circuit of this construction, however, there arises need for making larger the voltage of the driver circuit than the maximum value of the AC signal voltage dependent upon certain conditions of the load in order to pass the AC signal voltage through the bidirectional switch. More particularly, due to the fact that when the current flowing through the thyristor decreases below the self-holding current thereof, the thyristor turns off to nullify its current abruptly, it is necessary to continue supplying the gate current in order that the thyristor main current may flow successively. In the case of a load consisting of mere resistive component, simultaneous decreases in the load current and the level voltage allows the gate current to continue flowing and no problem occurs.

In the case of an inductive load or a capacitive load, however, the load current waveform and the load voltage waveform become out of phase and at the time that the load current decreases to a value at which the gate current is required to be supplied to the thyristor, the load voltage travels near its maximum value. Therefore, it is necessary to provide a gate driver circut having a larger driving voltage than the maximum value of the signal voltage.

An object of this invention is to provide a semiconductor bidirectional switch circuit wherein the gate currents of the thyristors are allowed to continue flowing at a low drive voltage irrespective of the amplitude of an AC signal voltage so that even when an AC signal current decreases in absolute value below self-holding currents of the thyristors, the AC signal may be passed through the thyristor switch without being subjected to instantaneous interruptions.

Another object of this invention is to provide a semiconductor bidirectional switch circuit having high gate control sensitivity.

According to this invention, these objects can be accomplished by providing a semiconductor bidirectional switch circuit comprising a bidirectional switch including two thyristors connected in antiparallel relationship, two bypass circuits each including at least one transistor for bypassing therethrough a part of the main current flowing through corresponding one of the respective thyristors from the anode to the cathode-gate of each thyristor, a first driver circuit for supplying a current to the cathode-gate of each of the thyristors, and a second driver circuit for extracting a current from the base of the transistor of each of the two bypass circuits. The first and second driver circuits are arranged in such a manner that the first and second driver circuits respectively have a first and second voltage source and the absolute value of the respective voltages of the first and second voltage sources is under any load conditions smaller than the absolute value of the maximum voltage of the AC signal passing through the bidirectional switch circuit.

This invention will be understood more fully from the following detailed description taken in conjunction with the accompanying drawings in which.

Before going into a description of specific embodiments of the present invention, a prior art semiconductor bidirectional switch circuit and waveforms of related load voltage and load current will be explained with reference to FIGS. 1 and 2.

Figure 1:
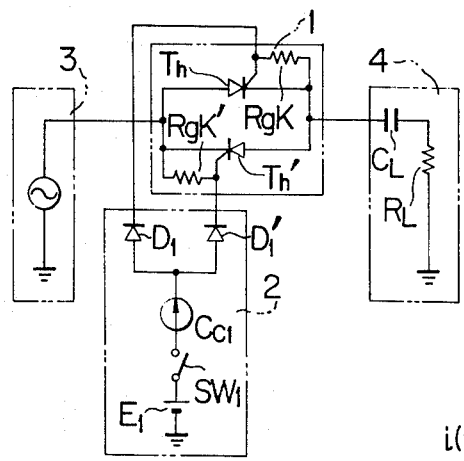
FIG. 1 is a circuit diagram of an example of a prior art semiconductor bidirectional switch circuit using antiparallel-connected reverse-blocking triode thyristors.
Figure 2:
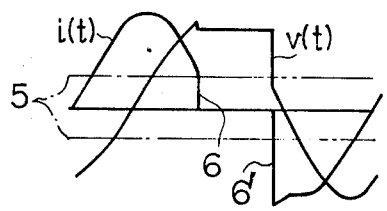
FIG. 2 is a waveform diagram showing a load voltage and a load current in the circuit of FIG. 1.

As exemplified in FIG. 1, the prior art semiconductor bidirectional switch circuit comprises a bidirectional switch 1 reverse-blocking triode thyristors $Th$ and $Th'$ connected in antiparallel relationship for passing an AC signal. When both the gates of the two thyristors are triggered with a current from a driver circuit 2 which includes a voltage source $E_1$, a switch $S_{W1}$, a constant current circuit $C_{Cl}$ and reverse current blocking diodes $D_1$ and $D_1'$, an AC signal is allowed to pass through the bidirectional switch. Resistors $R_{gk}$ and $R_{gk}'$ connected between the gates and the cathode of the respective thyristors $Th$ and $Th'$ serves to eliminate or reduce the $dv_{dt}$ effect inherent to a thyristor, at the sacrifice of increase in the drive current and the self-holding current for the thyristors which results from additional currents to be passed through these resistors $R_{gk}$ and $R_{gk}'$.

Where the bidirectional switch 1 is connected, for example, with a signal source 3 and a capacitive load 4 including capacitive component $C_L$ and resistive, bidirectional switch 1 under a most basic circuit condition as shown in FIG. 1, a load current waveform ($t$) is about $\pi2$ loading phase with respect to a load voltage waveform $v(t)$ so that the gate current is prevented to continue flowing into the gate of the thyristor if the gate driver voltage is smaller that the maximum value of the load or signal voltage. The signal voltage, namely the voltage at the anode of the thyristor is approximately equal to the load voltage, namely the voltage at the cathode of the thyristor, when the thyristor is in the on state. As a result, for example, as shown at a portion 6 of the load current waveform $i(t)$ in FIG. 2, the load current falls to zero abruptly as soon as it has reached a level 5 at which a self-holding current of the thyristor per se exists. Then, the load or signal voltage decreases until it allows the gate current to flow into the gate so that the load current begins to flow abruptly in the reverse direction as designated at 6'. This results in shortcomings that not only a normal signal transmission to the load is prevented but also the abrupt change in the load current produces noises.

A countermeasure for this problem will be proposed wherein the gate driver voltage is selected to be larger than the maximum value of the signal voltage so that the gate current may always be allowed to flow. Such a countermeasure, however, is not economical and a high DC voltage for gate driver often impairs reliability of the circuit part components.

The invention is intended to eliminate these drawbacks by providing a semiconductor bidirectional switch circuit wherein a low voltage source drives the gate currents of thyristors, permitting them to continue flowing irrespective of both the load conditions and the amplitude or magnitude of an AC signal voltage so that even when being decreased in absolute value below self-holding currents of the thyristors, an AC signal current which alternates in both positive and negative polarities may be passed through the semiconductor bidirectional switch without being subjected to an instantaneous interruption.

Figure 3:
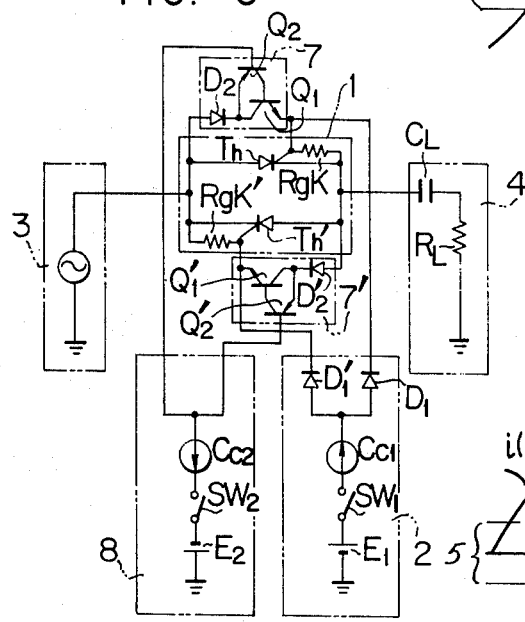
FIG. 3 is a circuit diagram of a first embodiment of a semiconductor bidirectional switch circuit according to this invention.

Referring now to FIG. 3, a semiconductor bidirectional switch first embodying the invention will be described. In the FIG., numeral 1 generally designates a thyristor switch including antiparallel-connected reverse-blocking triode thyristors $Th$ and $Th'$ for bidirectional transmission coupled with resistors $R_{gk}$ and $R_{gk}'$ for eliminating or reducing the $dv/dt$ effect inherent to a thyristor, 2 a driver circuit which includes two reverse current blocking diodes $D_1$ and $D_1'$ and a single constant current circuit $C_{Cl}$ for triggering the respective gates of the antiparallel-connected thyristor $Th$ and $Th'$ of the thyristor switch 1, 3 a signal source, 4 a capacitive load including capacitive component $C_l$ and resistive component $R_l$, 7 a bypass circuit including an NPN transistor $Q_1$ and a PNP transistor $Q_2$ in Darlington connection and a diode $D_2$ for preventing decrease in inverse breakdown voltage as well, 7' another bypass circuit similar to the bypass circuit 7 and including Darlington connected transistors $Q_1'$ and $Q_2'$ and diode $D_2'$ and 8 a driver circuit which includes a constant current circuit $C_{C2}$, a switch $SW_2$ and a negatively connected DC voltage source $E_2$ and which is adapted to drive the transistor $Q_2$ and $Q_2'$.

Figure 4:
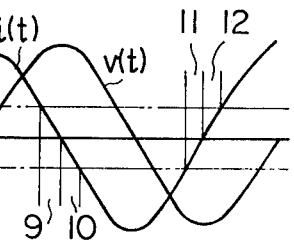
FIG. 4 is a waveform diagram showing a load voltage and a load current in the circuit of FIG. 3.

FIG. 4 shows waveforms useful to explain the operation of the semiconductor bidirectional switch shown in FIG. 3 by way of an example wherein a load current waveform $i(t)$ is under the worst condition with respect to a load voltage waveform $v(t)$, i.e., in $\pi/2$ leading phase. Numeral five designates the minimum self-holding current values for the respective thyristors $Th$ and $Th'$ connected in antiparallel relationship in the thyristor switch 1, and 9, 10, 11 and 12 regions at which the load current $i(t)$ decreases in absolute value below the self-holding current 5 and therefore such adverse instantaneous interruption of the thyristor as illustrated occuring at the level 6 in FIG. 2 occur unless the gate current is supplied, the regions being illustrated as four divisions for the convenience of operational description.

At the region 9, first since the load voltage $v(t)$ travels near the positive maximum value, it is necessary to provide a very large or high drier voltage if the cathode-gate driver circuit 2 alone is relied to supply the gate current as in the prior art semiconductor bidirectional switch. According to the circuit arrangement FIG. 3, however, the driver circuit 8 for driving the PNP transistors $Q_2$ and $Q_2'$ enables the PNP transistor $Q_2$ of the bypass circuit 7 at a low voltage so as to then enable the NPN transistor $Q_1$ to thereby supply a current to the cathode-gate of the associated thyristor $Th$ through the diode $D_2$ and the NPN transistor $Q_1$. In other words, since the thyristor $Th$ in question assumes a positive high potential, a current is readily passed through the diode $D_2$ and the emitter-base circuit of the PNP transistor $Q_2$ to the driver circuit 8 having a negative pole source $E_2$. Accordingly, a portion of the current on the main current path on the anode side of the thyristor Th in question can readily be bypassed to the cathode-gate of the thyristor Th through the diode $D_2$ and the NPN transistor $Q_1$, thereby triggering the gate of the thyristor Th to prevent the thyristor $Th$ from being turned off. Next, at the region 10, the load voltage $v(t)$ still travels near the positive maximum value while the direction of the load current $i(t)$ is reversed. Therefore, the cathode-gate of the backward thyristor $Th'$ is supplied with a current through the bypass circuit 7' based on a similar principle to that for the region 9 so that the thyristor switch 1 can be prevented from turning off. On the other hand, since the load voltage $v(t)$ travels near the negative maximum value at the region 11, it is possible to trigger the cathode-gate of the thyristor $Th'$ with ease by the cathode-gate driver circuit 2 at a low voltage in the prior art manner. Similarly, it is apparent that the cathode-gate of the thyristor $Th$ may be easily triggered in the region 12 with a current at a low voltage from the driver circuit 2. Due to the fact that a negative high voltage is required to energize the driver circuit 8 for driving the PNP transistors $Q_2$ and $Q_2'$ at these regions 11 and 12, in the case of transmission of an AC signal alternating in both the positive and negative polarities as shown in FIG. 4, the low voltage driving may be accomplished, according to the present invention, by combining the prior art cathode-gate driver circuit 2 with the transistor driver circuit 8 associated with the bypass circuits 7 and 7'. While, in the foregoing description, the semiconductor bidirectional switch has been explained in such a case that by way of an example, a capacitive load is connected as a load, a low voltage driving based on the principle of the present invention may be applicable to any types of load, for example, an inductive load wherein the load current assumes a lagging phase.

Figure 5:
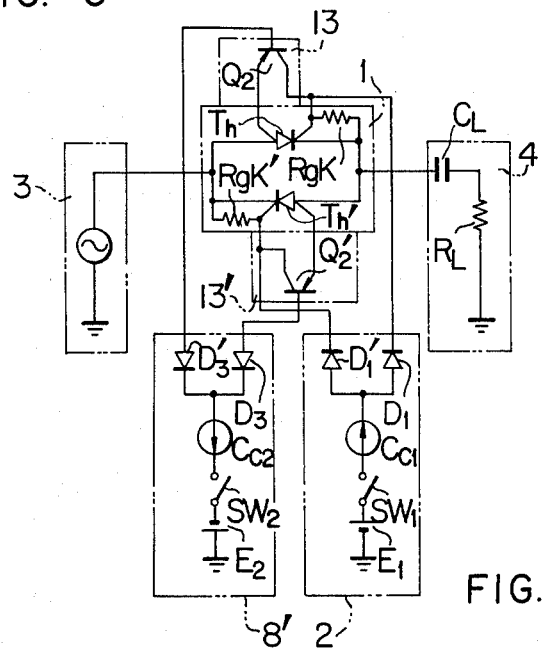
FIG. 5 is a circuit diagram of a second embodiment of a semiconductor bidirectional switch circuit according to this invention.

FIG. 5 shows a second embodiment of the invention. In the figure, numeral 1 generally designates a thyristor switch including antiparallel-connected reverse-blocking tetrode thyristors $Th$ and $Th'$ for bidirectional transmission coupled with resistors $R_{gk}$ for promoting resistance against $dv/dt$, 2 a driver circuit which includes two reverse current blocking diodes $D_l$ and $D_l'$ and a constant current source $C_{Cl}$ and which is adapted to trigger the cathode-gates of the antiparallel-connected reverse-blocking tetrode thyristors $Th$ and $Th'$ in the thyristor switch 1, 3 a signal source, 4 a capacitive load circuit including capacitive component $C_L$ and resistive component $R_L$, 13 and 13' bypass circuits respectively including PNP transistors $Q_2$ and $Q_2'$, and 8' a driver circuit which includes two reverse current blocking diodes $D_3$ and $D_3'$ and a constant current source $C_{C2}$ and which is adapted to drive the transistors $Q_2$ and $Q_2'$.

Referring again to FIG. 4, the operation of the circuit arrangement of FIG. 5 will be described.

First, at the region 9, the load voltage $v(t)$ travels near the positive maximum value and a very large driver voltage is required to supply the gate current if the cathode-gate driver circuit 2 alone is relied on as in the prior art. According to the circuit arrangement shown in FIG. 5, however, the PNP transistor $Q_2$ included in the bypass circuit 13 can be enabled at a low voltage by means of the driver circuit 8' so that a current may be extracted from the anode-gate of the thyristor $Th$ associated with the bypass circuit 13, thereby supplying the cathode-gate of the thyristor $Th$ with a current through the emitter-collector circuit of the transistor $Q_2$. In other words, since the thyristor $Th$ in question assumes a positive high potential, a current may readily be passed from the anode-gate of the thyristor $Th$ to the negative pole of the driver circuit 8' through the emitter and base of the PNP transistor $Q_2$. Accordingly, a portion of the main current on the main current path on the anode side of the thyristor $Th$ can readily be bypassed through the PNP transistor $Q_2$ so as to obtain the anode-gate current and the cathode-gate current, thereby preventing the thyristor $Th$ from being turned off. Next, at the region 10, the load voltage $v(t)$ still travels near the positive maximum value while the direction of the load current $i(t)$ is reversed. Therefore, the anode-gate current and the cathode-gate current flow into the backward thyristor $Th'$ through the bypass circuit 13' based on a similar principle to that for the region 9 so that the thyristor switch 1 can be prevented to turn off. On the other hand, since the load voltage $v(t)$ travels near the negative maximum value at the regions 11 and 12 as aforementioned in connection with the embodiment of FIG. 3, it is possible to supply the cathode-gate current easily from the cathode-gate driver circuit 2 at a low voltage in the prior art manner. Due to the fact that a negative high voltage is required to energize the transistor driver circuit 8' at these regions 11 and 12, in the case of transmission of an AC signal alternating in both the positive and negative polarities as shown in FIG. 4, the low voltage driving may be accomplished by combining the prior art cathode-gate driver circuit 2 with the driver circuit 8' together with its bypass circuits 13 and 13', according to the invention.

Figure 6:
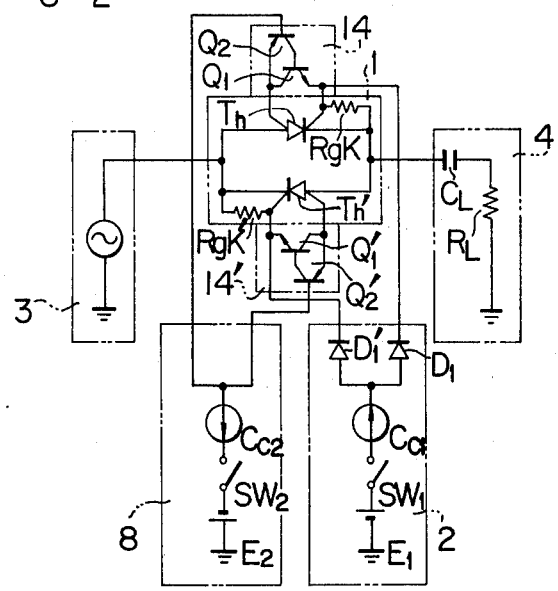
FIG. 6 is a circuit diagram of a third embodiment of a semiconductor bidirectional switch circuit according to this invention.

Turning to FIG. 6, a third embodiment of the invention will be described wherein bypass circuits 14 and 14' respectively comprise Darlington-connected PNP and NPN transistors $Q_2$ and $Q_1$ and similarly, Darlington-connected PNP and NPN transistors $Q_2'$ and $Q_1'$ which are suitable for the semiconductor integrated circuit formation. More particularly, in semiconductor integrated circuits, PNP transistors of lateral type are generally used, individual of which has a large base-emitter withstand voltage and a base-collector withstand voltage as well but a small current amplification. Accordingly, by combining, as shown in FIG. 6, the PNP transistor $Q_2$ with the NPN transistor $Q_1$, or the PNP transistor $Q_2'$ with the NPN transistor $Q_1'$, tending to have a large current amplification, it is possible to minimize the driver current for the PNP transistor $Q_2$ or $Q_2'$. The lateral PNP transistor $Q_2$ or $Q_2'$ is effective to provide a satisfactory withstand voltage, cancelling the need for providing the reverse current blocking diodes $D_3$ and $D_3'$ which are used in the embodiment of FIG. 5. With this circuit construction, too, the thyristor switch 1 can be prevented from being turned off at the regions 9 and 10 shown in FIG. 4 by driving the bypass circuits 14 including the PNP and NPN transistors $Q_2$ and $Q_1$ or the bypass circuit 14' including the PNP and NPN transistors $Q_2'$ and $Q_1'$ by means of the driver circuit 8.

As has been described, this invention can provide a semiconductor bidirectional switch circuit wherein the gate current can be supplied to the thyristor by low voltage driving irrespective of the cathode potential of the thyristor so that an AC signal alternating in both positive and negative polarities may be passed through the thyristor switch irrespective of the load conditions.

Figure 7:
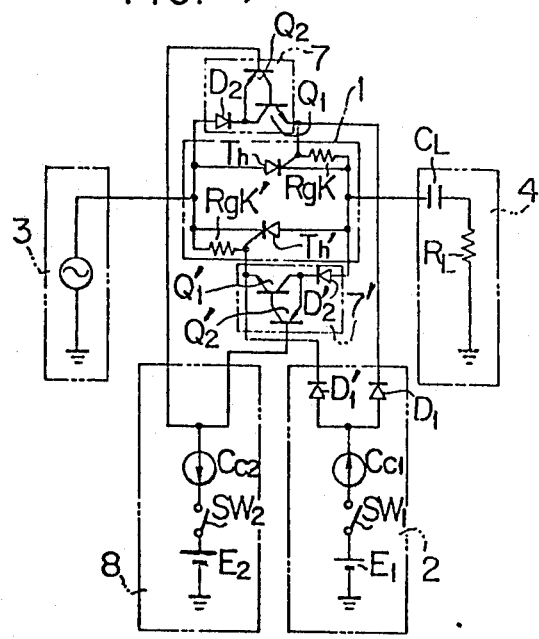
FIGS. 7 and 8 are circuit diagrams of embodiments according to this invention.
Figure 8:
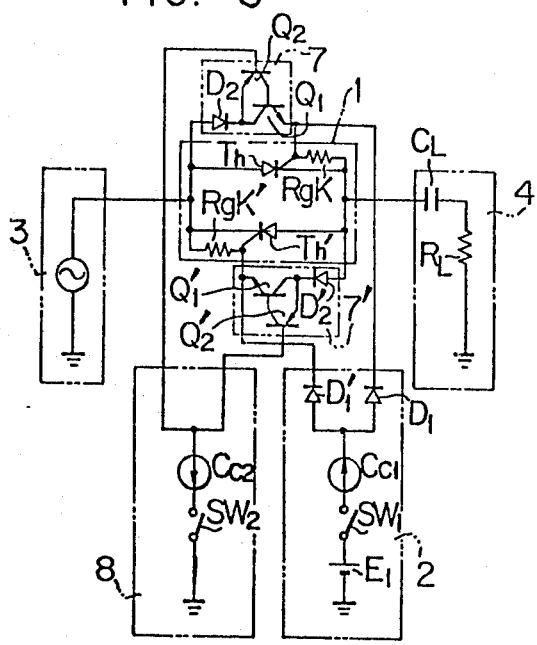

It will be appreciated that the second and third embodiments as shown in FIGS. 5 and 6 are advantageous in that both the anode-gate and cathode-gate are driven to enhance sensitivity. The switch $SW_1$ for the cathode-gate driver circuit 2 and the switch $SW_2$ for the driver circuit 8 or 8' for driving the PNP transistors $Q_2$ and $Q_2'$ shown in FIG. 3, FIG. 5 or 6 may be closed simultaneously during the transmission of an AC signal; alternatively, these switches may be closed independently in accordance with required conditions. Further, the voltage source for any one of the two driver circuits may be omitted by operating the one driver circuit by utilizing the potential of the thyristor which varies in accordance with the AC signal as illustrated in FIG. 8. When two voltage sources are used, it is not always necessary to arrange these power sources in reverse polarity fashion but it is possible to arrange them in the same polarity fashion as illustrated in FIG. 7.

What is claimed is:

1. A semiconductor bidirectional switch circuit for passing an AC signal comprising:
    a bidirectional switch including a first and a second thyristor connected in antiparallel relationship;
    a first bypass circuit including at least one transistor for bypassing therethrough a part of a main current of said first thyristor from an anode of said first thyristor to a cathode-gate of the same;
    a second bypass circuit including at least one transistor for bypassing therethrough a part of a main current of said second thyristor from an anode of said second thyristor to a cathode-gate of the same;
    a first driver circuit including a first voltage source, for supplying a current to the cathode-gate of each of said first and second thyristors;
    a second driver circuit including a second voltage source, for extracting a current from a base of the transistor of each of said first and second bypass circuits; and
    the absolute value of each of the respective voltages of said first and second voltage sources being under any load conditions smaller than the absolute value of the maximum voltage of the AC signal.

2. A semiconductor bidirectional switch circuit according to claim 1, wherein said first voltage source is the same in polarity as said second voltage source.

3. A semiconductor bidirectional switch circuit according to claim 1, wherein said first voltage source is opposite in polarity to said second voltage source.

4. A semiconductor bidirectional switch circuit according to claim 1, any one of said first and second voltage sources has zero potential.

5. A semiconductor bidirectional switch circuit according to claim 1, wherein said respective first and second thyristors are a first and a second reverse-blocking triode thyristor each having an anode, a cathode and a cathode-gate; said first bypass circuit includes a first series circuit of a diode and at least one transistor connected between the anode and cathode-gate of said first reverse-blocking triode thyristor so as to allow a part of the main current of said first reverse-blocking triode thyristor to pass through said first series circuit; and said second bypass circuit includes a second series circuit of a diode and at least one transistor connected between the anode and cathode-gate of said second reverse-blocking triode thyristor so as to allow a part of the main current of said second reverse-blocking triode thyristor to pass through said second series circuit.

6. A semiconductor bidirectional switch circuit according to claim 5, wherein each of said first and second series circuits is constituted by a diode and a PNP transistor.

7. A semiconductor bidirectional switch circuit according to claim 5, wherein each of said first and second series circuits is constituted by a diode and a Darlington connection consisting of an NPN transistor and a PNP transistor.

8. A semiconductor bidirectional switch circuit according to claim 5, wherein said first driver circuit includes a constant current circuit and a first and a second diode, and the respective cathode-gate of said first and second reverse-blocking triode thyristors are connected to said signal constant current circuit through said first and second diodes.

9. A semiconductor bidirectional switch circuit according to claim 5, wherein said second driver circuit includes a constant current circuit, and the bases of the respective transistors of said first and second series circuits are connected to aid constant current circuit.

10. A semiconductor bidirectional switch circuit according to claim 1, wherrein said respective first and second thryistors are a first and a second reverse-blocking tetrode thyristor each having an anode, a cathode, an anode-gate, and a cathode-gate; and the respective transistors of said first and second bypass circuits are connected between the anode-gate and cathode-gate of said first reverse-blocking tetrode thyristor and between the anode-gate and cathode-gate of said second reverse-blocking tetrode thyristor.

11. A semiconductor bidirectional switch circuit according to claim 10, wherein the transistor of each of said first and second bypass circuit is a PNP transistor.

12. A semiconductor bidirectional switch circuit according to claim 10, wherein each of said first and second bypass circuits is constituted by a Darlington connection consisting of an NPN transistor and a PNP transistor.

13. A semiconductor bidirectional switch circuit according to claim 10, wherein said first driver circuit includes a constant current circuit and a first and a second diode, and the respective cathode-gates of said first and second reverse-blocking tetrode thyristors are connected to aid constant circuit through said first and second diodes.

14. A semiconductor bidirectional switch circuit according to claim 11, wherein second driver circuit includes a constant current circuit and a first and a second diode, and the respective bases of the PNP transistors of said first and second bypass circuits are connected to said constant current circuit through said first and second diodes.

15. A semiconductor bidirectional switch circuit according to claim 12, wherein said second driver circuit includes a constant current circuit, and the base of the PNP transistor constituting each of said first and second bypass circuit is connected to said constant current circuit.

* * * * *